(12) United States Patent
Sharma et al.

(10) Patent No.: US 8,293,551 B2
(45) Date of Patent: Oct. 23, 2012

(54) GALLIUM AND NITROGEN CONTAINING TRIANGULAR OR DIAMOND-SHAPED CONFIGURATION FOR OPTICAL DEVICES

(75) Inventors: Rajat Sharma, Goleta, CA (US); Andrew Felker, Goleta, CA (US)

(73) Assignee: Soraa, Inc., Fremont, CA (US)

( * ) Notice: Subject to any disclaimer, the term of this patent is extended or adjusted under 35 U.S.C. 154(b) by 0 days.

(21) Appl. No.: 13/163,482

(22) Filed: Jun. 17, 2011

(65) Prior Publication Data
US 2011/0315999 A1     Dec. 29, 2011

Related U.S. Application Data

(60) Provisional application No. 61/356,473, filed on Jun. 18, 2010.

(51) Int. Cl.
*H01L 21/66* (2006.01)
(52) U.S. Cl. .................................. 438/33; 257/76
(58) Field of Classification Search .................. 438/33; 257/76
See application file for complete search history.

(56) References Cited

U.S. PATENT DOCUMENTS

| | | |
|---|---|---|
| 5,764,674 A | 6/1998 | Hibbs-Brenner et al. |
| 6,335,771 B1 | 1/2002 | Hiraishi |
| 6,498,355 B1 | 12/2002 | Harrah et al. |
| 6,501,154 B2 | 12/2002 | Morita et al. |
| 6,639,925 B2 | 10/2003 | Niwa et al. |
| 6,809,781 B2 | 10/2004 | Setlur et al. |
| 6,858,882 B2 | 2/2005 | Tsuda et al. |
| 6,936,488 B2 | 8/2005 | D'Evelyn et al. |
| 6,956,246 B1 | 10/2005 | Epler et al. |
| 7,009,199 B2 | 3/2006 | Hall |
| 7,128,849 B2 | 10/2006 | Setlur et al. |
| 7,341,880 B2 | 3/2008 | Erchak et al. |
| 7,358,542 B2 | 4/2008 | Radkov et al. |
| 7,358,543 B2 | 4/2008 | Chua et al. |
| 7,733,571 B1 | 6/2010 | Li |
| 7,816,238 B2 | 10/2010 | Osada et al. |
| 7,858,408 B2 | 12/2010 | Mueller et al. |
| 7,862,761 B2 | 1/2011 | Okushima et al. |
| 7,923,741 B1 | 4/2011 | Zhai et al. |
| 8,044,412 B2 | 10/2011 | Murphy et al. |
| 2001/0048114 A1 | 12/2001 | Morita et al. |
| 2002/0105986 A1 | 8/2002 | Yamasaki |
| 2005/0199899 A1 | 9/2005 | Lin et al. |
| 2005/0224830 A1 | 10/2005 | Blonder et al. |
| 2006/0038542 A1 | 2/2006 | Park et al. |
| 2006/0205199 A1 | 9/2006 | Baker et al. |
| 2006/0213429 A1 | 9/2006 | Motoki et al. |
| 2007/0054476 A1 | 3/2007 | Nakahata et al. |
| 2008/0194054 A1 | 8/2008 | Lin et al. |
| 2008/0198881 A1 | 8/2008 | Farrell et al. |
| 2008/0210958 A1 | 9/2008 | Senda et al. |
| 2008/0285609 A1 | 11/2008 | Ohta et al. |
| 2008/0298409 A1 | 12/2008 | Yamashita et al. |

(Continued)

OTHER PUBLICATIONS

PCT communication including partial search and examination report for PCT/US11/41106 (Oct. 4, 2011).

(Continued)

*Primary Examiner* — Julio J Maldonado
*Assistant Examiner* — Robert Bachner
(74) *Attorney, Agent, or Firm* — Kilpatrick Townsend & Stockton LLP

(57) ABSTRACT

A gallium and nitrogen containing optical device has a base region and no more than three major planar side regions configured in a triangular arrangement provided from the base region.

6 Claims, 6 Drawing Sheets

U.S. PATENT DOCUMENTS

| | | |
|---|---|---|
| 2009/0065798 A1 | 3/2009 | Masui et al. |
| 2009/0072252 A1 | 3/2009 | Son et al. |
| 2009/0095973 A1 | 4/2009 | Tanaka et al. |
| 2009/0250686 A1 | 10/2009 | Sato et al. |
| 2009/0273005 A1 | 11/2009 | Lin |
| 2009/0309110 A1 | 12/2009 | Raring et al. |
| 2009/0321778 A1 | 12/2009 | Chen et al. |
| 2010/0001300 A1 | 1/2010 | Raring et al. |
| 2010/0025656 A1 | 2/2010 | Raring et al. |
| 2010/0148145 A1 | 6/2010 | Ishibashi et al. |
| 2010/0219505 A1 | 9/2010 | D'Evelyn et al. |
| 2011/0056429 A1 | 3/2011 | Raring et al. |

OTHER PUBLICATIONS

Farrell et al., 'Continuous-Wave Operation of AlGaN-Cladding-Free Nonpolar m-Plane InGaN/GaN Laser Diodes,' 2007, Japanese Journal of Applied Physics, vol. 46, No. 32, 2007, pp. L761-L763.

Feezell et al., 'AlGaN-Cladding-Free Nonpolar InGaN/GaN Laser Diodes,' Japanese Journal of Applied Physics, vol. 46, No. 13, 2007, pp. L284-L286.

Haskell et al., 'Defect Reduction in (1100) m-plane gallium nitride via lateral epitaxial overgrowth by hydride vapor phase epitaxy', Applied Physics Letters 86, 111917 (2005), pp. 1-3.

Kojima et al., 'Stimulated Emission At 474 nm From an InGaN Laser Diode Structure Grown on a (1122) GaN Substrate,' Applied Physics Letters, vol. 91, 2007, pp. 251107-251107-3.

Kubota et al., 'Temperature Dependence of Polarized Photoluminescence From Nonpolar m-Plane InGaN Multiple Quantum Wells for Blue Laser Diodes,' Applied Physics Letter, vol. 92, 2008, pp. 011920-1-011920-3.

Tsuda et al., 'Blue Laser Diodes Fabricated on m-Plane GaN Substrates,' Applied Physics Express, vol. 1, 2008, pp. 011104-1-011104-3.

Tyagi et al., 'Semipolar (1011) InGaN/GaN Laser Diodes on Bulk GaN Substrates,' Japanese Journal of Applied Physics, vol. 46, No. 19, 2007, pp. L444-L445.

USPTO Office Action for U.S. Appl. No. 12/478,736 dated Feb. 7, 2012.

USPTO Office Action for U.S. Appl. No. 12/481,543 dated Jun. 27, 2011.

USPTO Office Action for U.S. Appl. No. 12/634,665 dated Mar. 12, 2012.

USPTO Office Action for U.S. Appl. No. 12/879,784 dated Jan. 25, 2012.

USPTO Notice of Allowance for U.S. Appl. No. 12/879,784 dated Apr. 3, 2012.

USPTO Office Action for U.S. Appl. No. 12/880,889 dated Feb. 27, 2012.

USPTO Office Action for U.S. Appl. No. 12/995,946 dated Mar. 28, 2012.

USPTO Office Action for U.S. Appl. No. 13/014,622 dated Nov. 28, 2011.

USPTO Office Action for U.S. Appl. No. 13/014,622 dated Apr. 30, 2012.

USPTO Office Action for U.S. Appl. No. 13/019,897 dated Mar. 30, 2012.

International Search Report for PCT application PCT/US2011/41106 (Jan. 5, 2012).

GALLIUM AND NITROGEN CONTAINING TRIANGULAR OR DIAMOND-SHAPED CONFIGURATION FOR OPTICAL DEVICES

CROSS REFERENCE TO RELATED APPLICATION

This application claims priority to U.S. Provisional Application No. 61/356,473, filed Jun. 18, 2010, which is incorporated herein by reference for all purposes.

BACKGROUND OF THE INVENTION

This invention relates generally to lighting techniques. More specifically, embodiments of the invention include techniques for manufacturing optical devices, such as light emitting diodes (LEDs) using a separation process of thick gallium and nitrogen containing substrate members, such as GaN configured in polar crystalline orientations. In some embodiments, the gallium and nitrogen containing substrate is configured in a triangular shape or a diamond shape. The invention can be applied to applications such as white lighting, multi-colored lighting, general illumination, decorative lighting, automotive and aircraft lamps, street lights, lighting for plant growth, indicator lights, lighting for flat panel displays, and other optoelectronic devices.

In the late 1800's, Thomas Edison invented the light bulb. The conventional light bulb, commonly called the "Edison bulb," has been used for over one hundred years. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light. Unfortunately, drawbacks exist with the conventional Edison light bulb. That is, the conventional light bulb dissipates more than 90% of the energy used as thermal energy. Additionally, the conventional light bulb routinely fails often due to thermal expansion and contraction of the filament element.

Solid state lighting techniques are known. Solid state lighting relies upon semiconductor materials to produce light emitting diodes, commonly called LEDs. At first, red LEDs were demonstrated and introduced into commerce. Red LEDs use Aluminum Indium Gallium Phosphide or AlInGaP semiconductor materials. Most recently, Shuji Nakamura pioneered the use of InGaN materials to produce LEDs emitting light in the blue color range for blue LEDs. The blue colored LEDs led to innovations such as solid state white lighting, the blue laser diode, which in turn enabled the Blu-Ray™ (trademark of the Blu-Ray Disc Association) DVD player, and other developments. Other colored LEDs have also been proposed.

High intensity UV, blue, and green LEDs based on GaN have been proposed and even demonstrated with some success. Efficiencies have typically been highest in the UV-violet, dropping off as the emission wavelength increases to blue or green. Unfortunately, achieving high intensity, high-efficiency GaN-based green LEDs has been particularly problematic. Additionally, GaN based LEDs have been costly and difficult to produce on a wide-scale in an efficient manner.

BRIEF SUMMARY OF THE INVENTION

Conventional LED fabrication process typically employs a wafer scribing and breaking procedure to generate individual LED chips. These wafers are typically scribed along two substantially orthogonal axes, wherein these individual axes are respectively parallel to and co-planar with two non-equivalent crystal plane orientations of the wafer. For example, for an LED wafer comprising GaN on sapphire singulated into square or rectangular chips, the two orthogonal scribe axes are respectively parallel to and co-planar with m-plane and a-plane orientations of the sapphire wafer, wherein the m-planes and a-planes are not equivalent by definition.

In a specific embodiment, the present method includes a scribe and break process for bulk c-plane GaN wafers. The wafers are scribed along two or more non-orthogonal axes. These two or more axes are respectively parallel to and co-planar with equivalent crystal planes of the GaN wafer. For example, a bulk c-plane GaN wafer is scribed along three axes (with an angle of 60° between each of these three axes) wherein these three axes are respectively parallel to and co-planar with three m-plane orientations of the c-plane GaN wafer. In a specific embodiment, the three m-plane orientations are equivalent by definition. In one or more aspects, the present invention includes a method to fabricate a triangular-shaped or diamond-shaped chip geometry in the case of c-plane GaN wafers, which may have several advantages over conventional square or rectangular geometries. This present invention utilizes the in-plane 6-fold rotational symmetry and crystallography unique to c-plane GaN wafers—GaN has the Wurtzite crystal structure according to a specific embodiment. In an alternative preferred embodiment, the bulk c-plane GaN wafer may be scribed along three axes (with an angle of 60 degrees between each of these three axes) wherein these three axes are respectively parallel to and co-planar with three a-plane orientations of the c-plane GaN wafer, the three a-plane orientations being equivalent by definition.

In a specific embodiment, the present invention provides a gallium and nitrogen containing substrate configured in a triangular shape consisting of no more than five surface regions. Preferably, the five surface regions comprise three surface regions configured from respective first equivalent planes and two surface regions configured from second equivalent planes.

In alternative embodiments, the invention provides a diamond shape substrate consisting of no more than six surface regions. Preferably, the six surface regions comprise four surface regions configured from respective first equivalent planes and two surface regions configured from second equivalent planes. A first surface region configured in a c plane orientation and a second surface region configured in the c-plane orientation. The method also includes exposing at least a first m-plane region, a second m-plane region, and a third m-plane region. Moreover, the present invention provides a method of separating die from a gallium and nitrogen containing substrate. The invention also includes a gallium and nitrogen containing optical device. The device includes a gallium and nitrogen containing substrate having a base region and no more than three major planar side regions configured in a triangular arrangement provided from the base region.

In a preferred embodiment, the present method and structure can include one or more of the following elements that can include variations, modifications, and alternatives.

1. A bulk c-plane GaN wafer with an overlying LED epitaxial structure and with p-type and n-type metallizations is fabricated, such that there are 'scribe streets' along three directions (at 60° angles relative to each other) separating individual LED traces on the wafer. The scribe streets are aligned to be respectively parallel to three m-plane orientations of the c-plane GaN wafer, and are designed to intersect such that the triangle shape defined by three scribe lines is an equilateral triangle.

2. The LED wafer is laser-scribed on a first surface of the wafer, along a first 'scribe street' direction. The scribe depth in the scribed regions on the first surface is typically 20-50% of the thickness of the LED wafer.

3. The LED wafer is then laser-scribed on a first surface of the wafer, along a second 'scribe street' direction. The scribe depth in the scribed regions on the first surface is typically 20-50% of the thickness of the LED wafer.

4. The LED wafer is laser-scribed on a first surface of the wafer, along the third 'scribe street' direction. The scribe depth in the scribed regions on the first surface is typically 20-50% of the thickness of the LED wafer.

5. The scribe depth in the scribed regions on the second surface is typically 20-50% of the thickness of the LED wafer.

6. The scribed LED wafer is then broken using an anvil breaker setup along the three 'scribe street' orientations. Breaking occurs along the planes defined by scribed regions on the first surface of the wafer in a specific embodiment. Breaking along the third 'scribe street' orientation yields individual triangle-shaped LED chips.

In a specific embodiment, the invention provides for a method for singulation of thick c-plane GaN wafers into triangle-shaped LED chips defined by three equivalent m-plane oriented sidewalls. In one or more embodiments, the m-plane is a natural break plane, which easily cleaves, in the case of c-plane GaN wafers, and therefore, a singulation process involving breaking exclusively or predominately along a set of m-plane orientations will have a higher yield than a process involving breaking along both m-plane orientations and a-plane orientations. In another specific embodiment, the present invention provides for a method for singulation of c-plane GaN wafers into triangle-shaped LED chips defined by three equivalent m-plane oriented sidewalls. In one or more embodiments, break along the a-plane yields a characteristic surface texture which results in improved light extraction.

The invention provides triangle-shaped chips characterized by improved light extraction when compared to conventional square- or rectangle-shaped chips, due to an increase in the per-pass probability of escape of in-plane emission arising from a decrease in the probability of total internal reflection at the sidewalls. Additionally, triangle-shaped chips provide fewer trapped trajectories of light than square or rectangle chips, so that the chip light extraction efficiency can be increased.

DETAILED DESCRIPTION OF THE INVENTION

Figure 2:
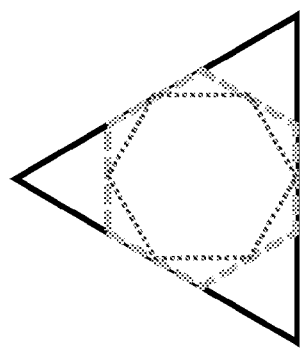
FIGS. 1 through 3 are diagrams illustrating a method for forming triangular shaped gallium and nitrogen containing material.
Figure 3:
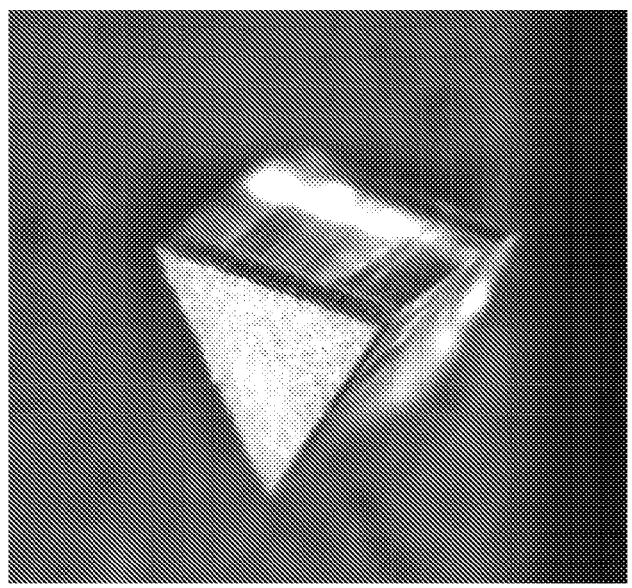
Figure 1:
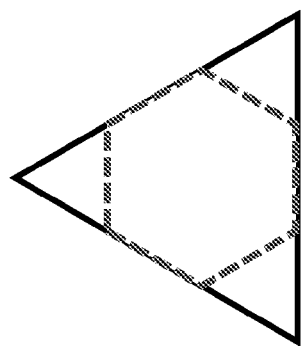

FIGS. 1 through 3 are simplified diagrams illustrating a method for forming a triangular shaped gallium and nitrogen containing material according to an embodiment of the present invention. As shown in FIG. 1, the invention provides a gallium and nitrogen containing substrate member. The member includes a gallium and nitrogen containing thickness of material configured in a triangular shape consisting of no more than five surface regions. Preferably, the five surface regions comprises a three surface regions configured from respective first equivalent planes and the five surface regions excluding the three surface regions comprises two surface regions configured from second equivalent planes. As shown is a top-view of a triangular shaped chip showing orientation of three edges relative to GaN m-planes according to a specific embodiment (see dashed or red lines).

In a specific embodiment, the gallium and nitrogen containing substrate is triangular shaped. The triangular shaped substrate may be an extruded triangular shape. In a specific embodiment, the three surface regions of the triangular shaped regions are respective first equivalent planes, which are either m-planes or a-planes, see FIG. 2. The second surface regions of the triangular shaped regions are respective second equivalent planes, which are c-planes. In a specific embodiment, the gallium and nitrogen containing substrate is a GaN substrate. Of course, there can be other variations, modifications, and alternatives.

In a specific embodiment, the three surface regions of the triangular shaped regions are configured from respective scribes provided on respective first equivalent planes. As an example, the three surface regions are configured by an interior region of 180 Degrees or the like. In other examples, the two surface regions are configured in parallel arrangement to each other.

Referring now to FIG. 3, an optical micrograph of a triangular shaped LED chip is illustrated. As shown, the GaN substrate is configured from bulk c-plane GaN having three m-plane surface orientations exposed. As also shown, the gallium and nitrogen containing member comprises at least an optical device thereon in at least one specific embodiment. The optical device can be a light emitting diode, a laser device, or other device, as well as combinations of optical and electrical devices. Other types of devices can include electrical switching devices, mechanical devices, and any combination of these and the like.

Figure 5:
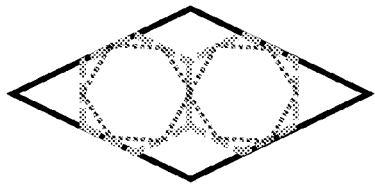
FIGS. 4 through 6 are diagrams illustrating a method for forming a diamond shaped gallium and nitrogen containing material.
Figure 6:
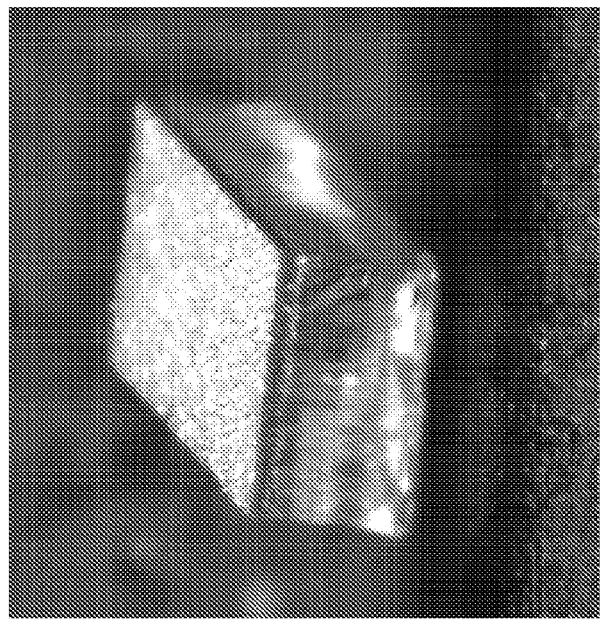
Figure 4:
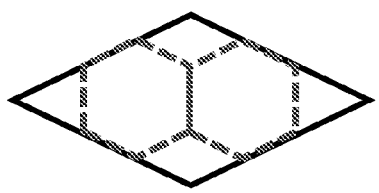

FIGS. 4 through 6 are simplified diagrams illustrating a method for forming a triangular shaped gallium and nitrogen containing material according to an embodiment of the present invention. As shown, the substrate shows four edges relative to GaN m-planes (see dotted or red lines). The substrate member includes a gallium and nitrogen containing thickness of material configured in a diamond shape consisting of no more than six surface regions. Preferably, the six surface regions comprises four surface regions configured from respective first equivalent planes and the six surface regions excluding the four surface regions comprises two surface regions configured from second equivalent planes.

In a specific embodiment, the substrate that is the diamond shape is free from a 90 degree intersection between any two of the first four surface regions out of the six surface regions. In a specific embodiment, the diamond shape includes the first equivalent planes that are either m-planes or a-planes, as illustrated by FIG. 5. As shown, the four edges are associated with GaN a-planes (green dashed lines or dashed lines). In a specific embodiment, the diamond shape includes the second equivalent planes that are c-planes.

The four surface regions of the diamond shape are configured from respective scribes provided on respective first equivalent planes in a specific embodiment. Preferably, the four surface regions are configured by an interior region free from a 90 degree angle. Preferably, the two surface regions are configured in parallel arrangement to each other.

Referring now to FIG. 6, an optical micrograph of a diamond shaped LED chip is illustrated. As shown, the GaN substrate is configured from bulk c-plane GaN having four m-plane surface orientations exposed. As also shown, the gallium and nitrogen containing member comprises at least an optical device thereon in at least one specific embodiment. The optical device can be a light emitting diode, a laser device, or other device, as well as combinations of optical and electrical devices.

Figure 7:
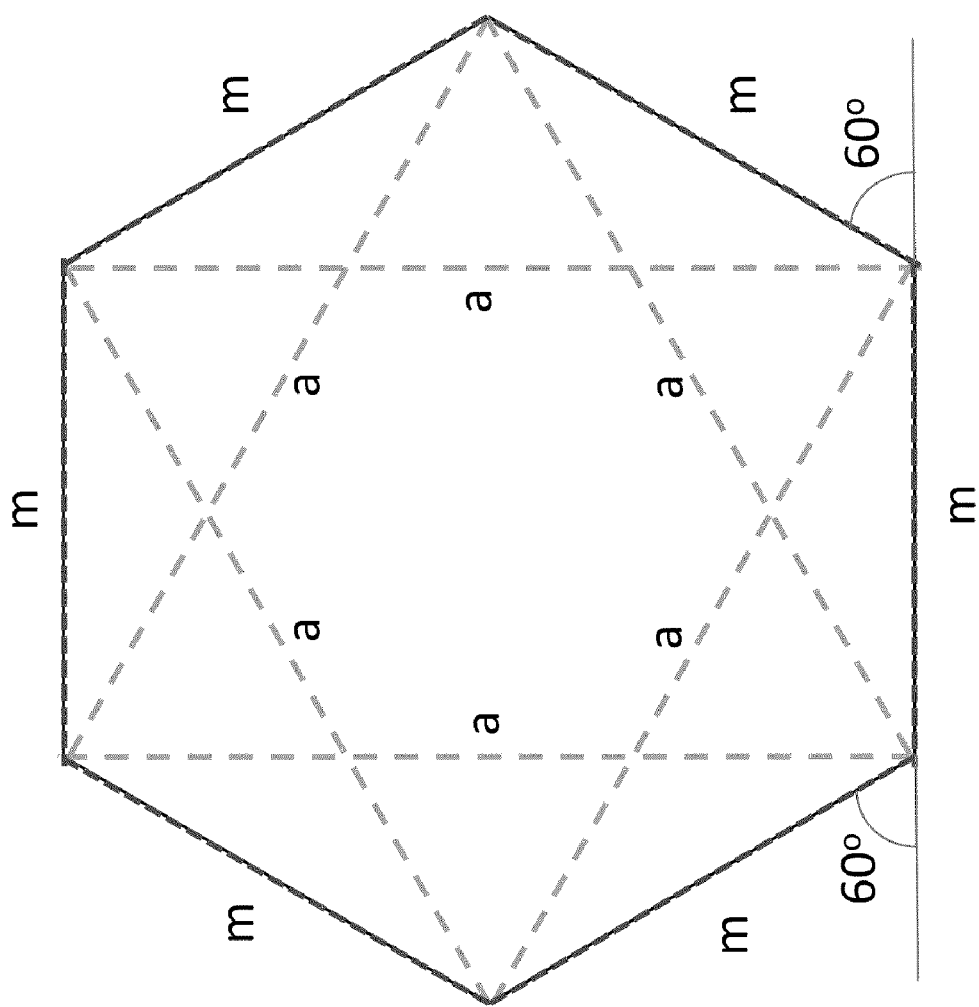
FIG. 7 is a diagram showing relative orientations of m-planes (red lines) and a-planes (green lines), wherein the plane of the diagram represents a c-plane, in the case of the GaN (Wurtzite) crystal structure.

FIG. 7 is a simplified diagram showing relative orientations of m-planes (red lines) and a-planes (green lines), wherein the plane of the diagram represents a c-plane, in the case of the GaN (Wurtzite) crystal structure according to an embodiment of the present invention.

Figure 8:
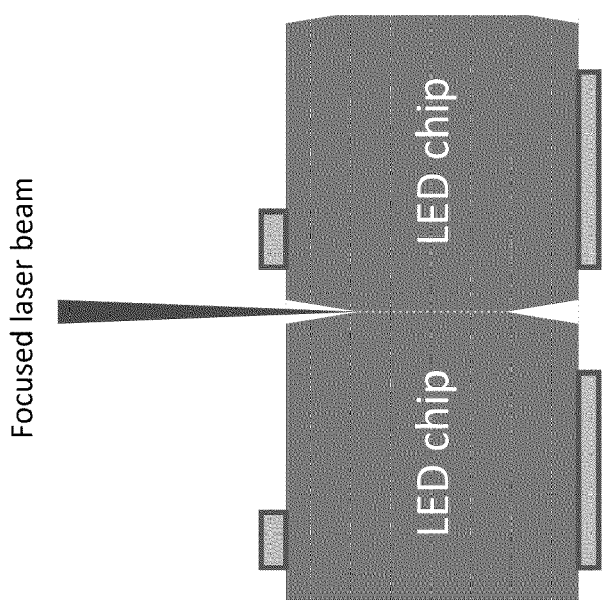
FIG. 8 is a side-view diagram depicting a laser scribing process for an optical device.

FIG. 8 is a simplified side-view diagram depicting a laser scribing process for an optical device according to an embodiment of the present invention. In a specific embodiment, the LED wafer is laser-scribed within the 'scribe streets' on a first surface of the wafer, along one or more axes according to a specific embodiment. In other embodiments, the scribing can occur using a saw, a diamond scribe, a chemical etchant (with or without a photo-assisted component), reactive ion or plasma etchant or milling, or combinations, and the like. The scribe depth in the scribed regions on the first surface is typically 20-50% of the thickness of the LED wafer according to a specific embodiment. In other embodiments, the scribe depth can vary and have other dimension.

In a specific embodiment, the LED wafer is then flipped over, and is then laser-scribed within the 'scribe streets' on a second surface of the wafer, along one or more axes, taking care to ensure that the scribes on the second surface are aligned to be substantially overlying the scribes on the first side of the wafer. In a specific embodiment, the scribe depth in the scribed regions on the second surface is typically 20-50% of the thickness of the LED wafer The scribed LED wafer is then broken using an anvil breaker setup, such as the one further described below.

Figure 9:
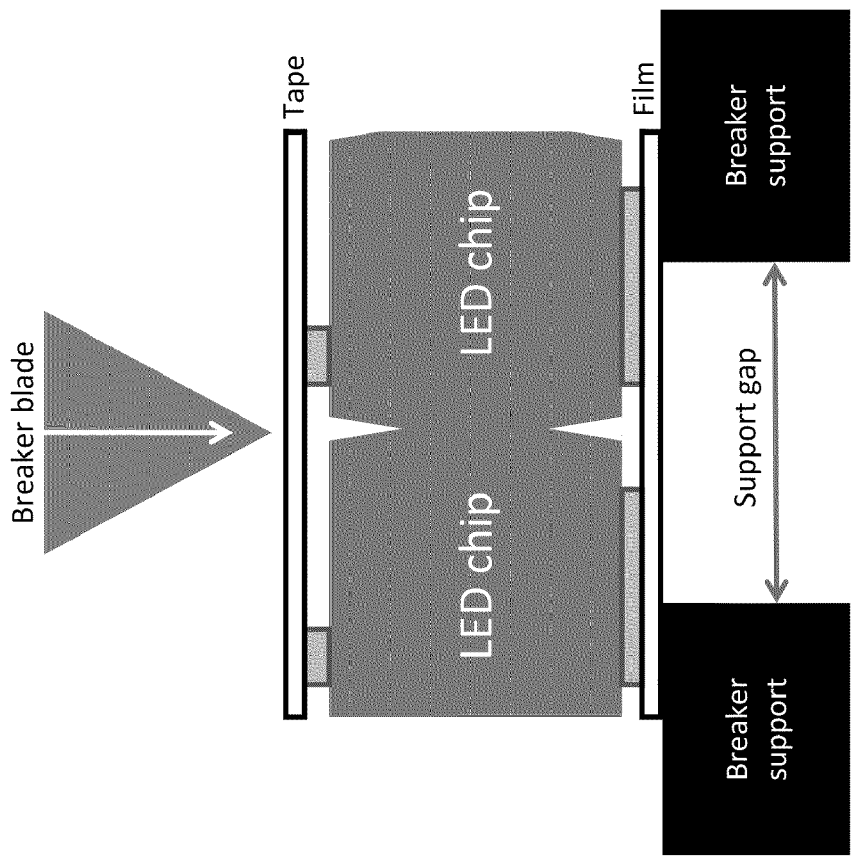
FIG. 9 is a side-view diagram depicting a breaking process for an optical device.

FIG. 9 is a simplified side-view diagram depicting a breaking process for an optical device according to an embodiment of the present invention. As shown, breaking occurs along the planes defined by two aligned scribed regions on the two opposing sides of the wafer. In a specific embodiment, the present method provides for the singulation of thick GaN wafers, thereby eliminating the need for expensive and time-consuming lapping and polishing steps in the LED fabrication process.

Figure 10:
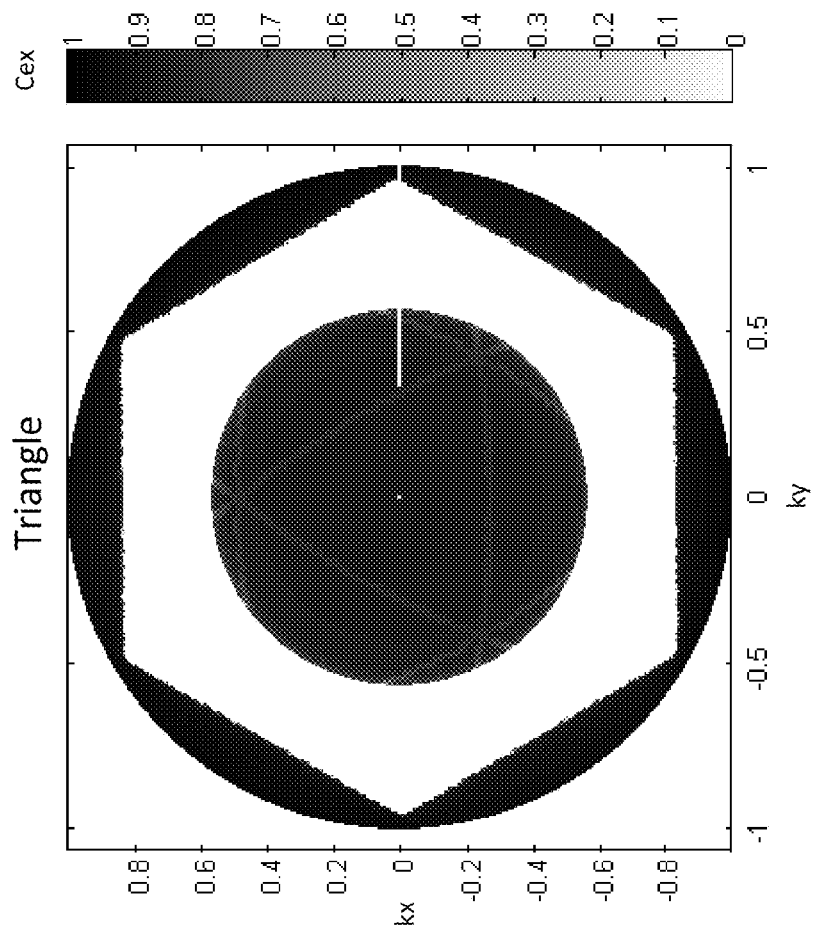
FIG. 10 is the light extraction diagram obtained from modeling light extraction in a square and a triangular chip.
Figure 10:
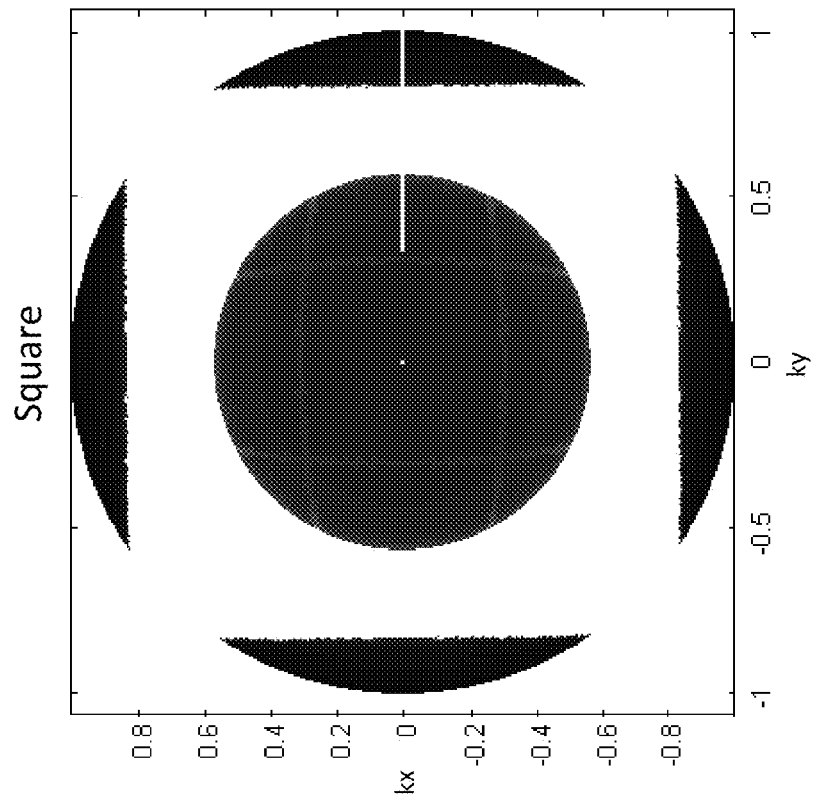

FIG. 10 displays modeling results which compare the light extraction efficiency Cex of square and triangular chips. The simulation yields the light extraction diagram, e.g. the extraction efficiency versus the direction of emission of photons (kx,ky). As can be seen, square chips offer 5 extraction cones (one per face) yielding Cex=46%. Triangular chips offer 7 extraction cones (each vertical sidewall can extract in-plane light directly or after a bounce off another sidewall) yielding Cex=57%. These numbers pertain to realistic structures (including loss in the metals and GaN substrate) and do not integrated any surface roughening of the chip walls.

Figure 11:
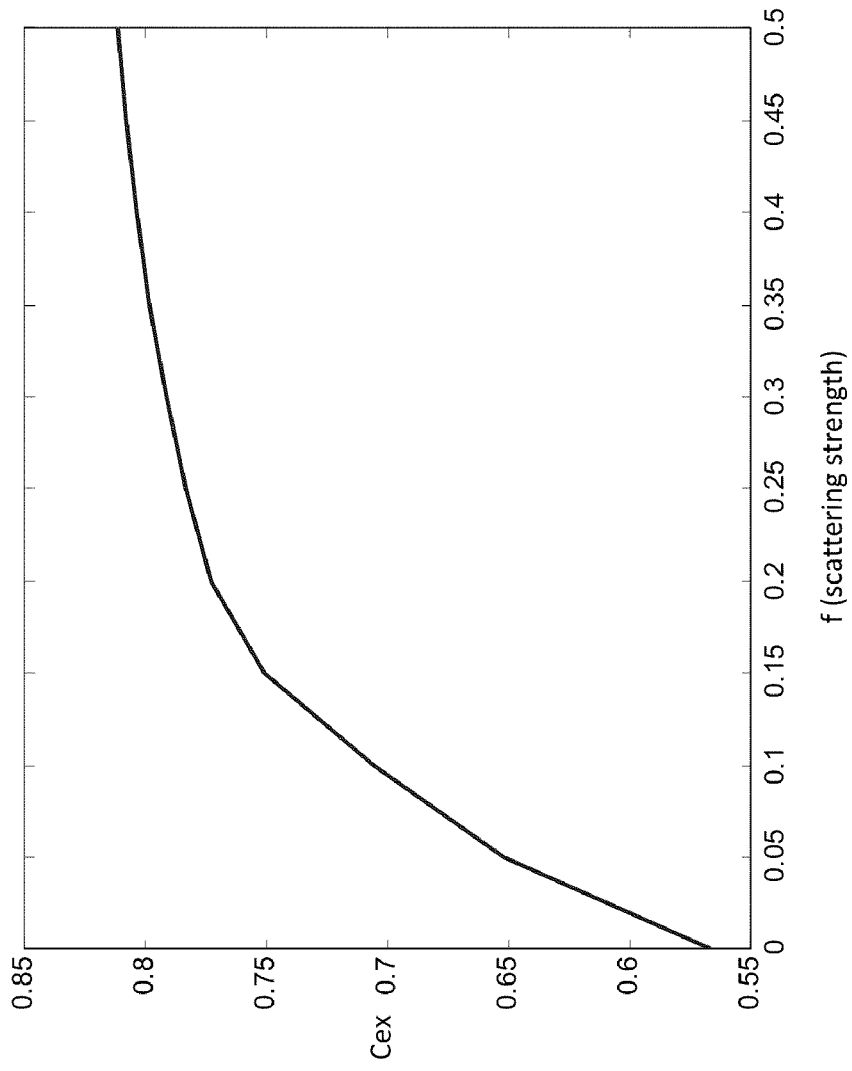
FIG. 11 is a simulation of light extraction efficiency of a triangular chip as a function of sidewall surface roughening.

FIG. 11 illustrates the impact of sidewall roughening on light extraction efficiency, as predicted by modeling. For efficient sidewall roughness, the light extraction efficiency of a triangular chip can exceed 80% (versus 57% for smooth sidewalls).

In a specific embodiment, the present method provides for the singulation of thick GaN wafers into individual LED chips with lateral chip dimensions that are significantly smaller than those enabled by standard single-sided scribe methods. In other embodiments, the present method provides higher process yields at the scribe and break process steps than conventional methods. Additionally, there is a reduced incidence of chip-outs, as well as doublets (pairs of chips that are not separated during the break step). In other embodiments, the scribed regions may induce surface roughening on the side-walls of the generated LED chips which may enhance light extraction from the chips when compared to chips generated by scribing on a single side.

In other embodiments, the present method can also include other variations, combinations, and modifications, as described below.

1. The LED wafer may be a c-plane GaN wafer
2. An individual LED wafer may be scribed on at least one of the two surfaces using at least one of a plurality of scribe methods in other embodiments. The scribe methods may include at least two or more methods selected from laser scribing, diamond scribing, and sawing/dicing.
3. In a specific embodiment, the scribe depth on any one side of the LED wafer may be varied between 0.5% and 99.5% of the thickness of the LED wafer.
4. In an alternative embodiment, the scribed regions may have continuous scribe lines, or may comprise of dashed or dotted scribe lines. The scribed regions along two or more axes may or may not intersect in the regions defined by intersecting 'scribe streets,' by design according to a specific embodiment.
5. Also, scribing may be performed along at least one 'scribe street' orientation on a first surface, and along at least one 'scribe street' orientation on the second surface, such that at least two 'scribe street' orientations chosen are non-parallel according to a specific embodiment.
6. The scribed LED wafer may be broken using a method or a plurality of methods chosen from a group including anvil breaker, roller breaker or breaker bar, combinations, and the like.

While the above is a full description of the specific embodiments, various modifications, alternative constructions and equivalents may be used. The present specification describes one or more specific gallium and nitrogen containing surface orientations, but it would be recognized that any one of a plurality of family of plane orientations can be used. The above description and illustrations should not be taken as limiting the scope of the present invention which is defined by the appended claims.

What is claimed is:
1. A gallium and nitrogen containing substrate comprising:
a thickness of material configured in a diamond shape consisting of no more than six surface regions;
wherein the six surface regions comprises four surface regions configured from respective first equivalent crystal planes; and
wherein the six surface regions excluding the four surface regions include two surface regions configured from second equivalent crystal planes.

2. The substrate of claim 1 wherein the diamond shape does not have a 90 degree intersection between any two surface regions out of the four surface regions.

3. The substrate of claim 1 wherein the first equivalent planes are either m-planes or a-planes.

4. The substrate of claim 1 wherein the second equivalent planes are c-planes.

5. The substrate of claim 1 wherein the four surface regions are configured from respective scribes provided within a vicinity of respective first equivalent planes.

6. The substrate of claim 1 wherein the first equivalent planes are configured on respective a-planes.

* * * * *